United States Patent
Rempel et al.

(10) Patent No.: US 12,160,311 B2
(45) Date of Patent: Dec. 3, 2024

(54) IN-PHASE AND QUADRATURE (I/Q) ENCODING FOR VARIABLE DATA RATES

(71) Applicant: Telefonaktiebolaget LM Ericsson (publ), Stockholm (SE)

(72) Inventors: Glen Rempel, Kanata (CA); Joleen Hind, Ottawa (CA); Viktor Ackovik, Ottawa (CA)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 401 days.

(21) Appl. No.: 17/628,699

(22) PCT Filed: Oct. 9, 2019

(86) PCT No.: PCT/IB2019/058606
§ 371 (c)(1),
(2) Date: Jan. 20, 2022

(87) PCT Pub. No.: WO2021/069959
PCT Pub. Date: Apr. 15, 2021

(65) Prior Publication Data
US 2022/0271862 A1   Aug. 25, 2022

(51) Int. Cl.
*H03M 7/40* (2006.01)
*H03M 7/32* (2006.01)
(Continued)

(52) U.S. Cl.
CPC ........ *H04L 1/0013* (2013.01); *H03M 7/3013* (2013.01); *H03M 7/40* (2013.01);
(Continued)

(58) Field of Classification Search
None
See application file for complete search history.

(56) References Cited

U.S. PATENT DOCUMENTS

| 8,381,065 B2* | 2/2013 | Djordjevic | H04L 1/0051 714/755 |
| 2003/0067992 A1* | 4/2003 | Karaoguz | H04L 1/006 375/279 |

(Continued)

FOREIGN PATENT DOCUMENTS

| EP | 0524625 A2 | 1/1993 |
| WO | 2009/151893 A2 | 12/2009 |

OTHER PUBLICATIONS

International Search Report and Written Opinion dated Jul. 23, 2020 issued in PCT Application No. PCT/IB2019/058606, consisting of 14 pages.

*Primary Examiner* — Jay L Vogel
(74) *Attorney, Agent, or Firm* — Weisberg I.P. Law, P.A.

(57) ABSTRACT

According to one or more embodiments, a network node for communicating with at least one radio unit is provided. The network node including processing circuitry configured to: determine at least one code frame characteristic of a non-linear grid, map in-phase and quadrature, I/Q, data to non-linear grid having a plurality of regions that correspond to a plurality of code words where a plurality of bit sizes of the plurality of code words is a function of a radial distance from an origin of the non-linear grid, select a subset of the plurality of code words based at least in part on a target data rate for transmission, and cause transmission of the I/Q data based at least in part on the selected subset of the plurality of code words.

18 Claims, 9 Drawing Sheets

(51) Int. Cl.
  *H04L 1/00* (2006.01)
  *H04L 27/00* (2006.01)
  *H04L 27/36* (2006.01)

(52) U.S. Cl.
  CPC .......... *H04L 1/0006* (2013.01); *H04L 1/0009* (2013.01); *H04L 27/00* (2013.01); *H04L 27/36* (2013.01)

(56) References Cited

U.S. PATENT DOCUMENTS

| | | | |
|---|---|---|---|
| 2008/0170636 A1* | 7/2008 | Han | H04L 27/2615 375/261 |
| 2014/0219162 A1* | 8/2014 | Eyuboglu | H04L 5/005 370/315 |
| 2015/0178320 A1 | 6/2015 | Gao et al. | |
| 2016/0028447 A1* | 1/2016 | Etkin | H04B 7/024 455/561 |
| 2018/0091225 A1* | 3/2018 | Wang | H04B 10/612 |

* cited by examiner

IN-PHASE AND QUADRATURE (I/Q) ENCODING FOR VARIABLE DATA RATES

CROSS-REFERENCE TO RELATED APPLICATION

This application is a Submission Under 35 U.S.C. § 371 for U.S. National Stage Patent Application of International Application Number: PCT/IB2019/058606, filed Oct. 9, 2019 entitled "IN-PHASE AND QUADRATURE (I/Q) ENCODING FOR VARIABLE DATA RATES," the entirety of which is incorporated herein by reference.

TECHNICAL FIELD

Wireless communication and in particular, in-phase and quadrature (I/Q) encoding for variable data rates.

BACKGROUND

Encoding techniques for data transmission are generally used for converting data from one format into another format. The encoding of data may include compression of data where the size of the data being encoded is reduced. One or more various encoding techniques may be used in communication systems. FIG. 1 is a block diagram of a general transmission system 10 where a data source 12 communicates various bits of data to an encoder 14 for transmission at a specific bit rate over a transmission channel. A decoder 16 receives and decodes the encoded transmission. The data sink 18 receives the decoded bits. In other words, the data source 12 produces numerous bits where the transmission channel may have a specific bit rate allocation that may vary such that the encoding may not match the available bandwidth.

One example of system 10 is illustrated in FIG. 2. FIG. 2 shows a radio system, e.g., a radio dot system (RDS) indoor platform, where a digital interface is used to transfer in-phase and quadrature (I/Q) data between the one or more network nodes 20 and one or more radio units 22a-22n. The network node 20 may include one or more indoor radio units (IRUs) 24 and one or more digital units 26. A radio unit 22 may correspond to a compact radio with one or more antennas that may be powered by the IRU 24 via a local area network (LAN) cable, for example. The IRU 24 may be in communication with DU 26 that may pool resources and provide 3GPP functionality. The radio unit 22 may be configured to communicate data/signaling to/from with from/to one or more wireless devices 27a-27n.

However, existing encoding techniques do not achieve sufficiently high compression ratios to meet demands for data transmission over a channel that is associated with a specific bit rate, and these techniques fail to use all available bandwidth allowed by the specific bit rate such that communication between the one or more network nodes 20 and the one or more radio units 22 using existing encoding techniques is not optimal.

SUMMARY

Some embodiments advantageously provide a method and system for in-phase and quadrature (I/Q) encoding for variable data rates.

In one or more embodiments, in-phase and quadrature (I/Q) data is mapped to a nonlinear grid with an arbitrary number of sample points. Variable rate data encoding is used to map these samples points into a bit stream compatible with the available rate. Therefore, when the I/Q data rate and the channel bit rates are fixed, this technique allows the maximum number of bits consistent with the channel bandwidth.

According to one aspect of the disclosure, a network node for communicating with at least one radio unit is provided. The network node include processing circuitry configured to: determine at least one code frame characteristic of a non-linear grid, map in-phase and quadrature (I/Q) data to a non-linear grid having a plurality of regions that correspond to a plurality of code words where a plurality of bit sizes of the plurality of code words is a function of radial distance from an origin of the non-linear grid, select a subset of the plurality of code words based at least in part on a target data rate for transmission, and cause transmission of the I/Q data based at least in part on the selected subset of the plurality of code words.

According to one or more embodiments, the plurality of code words are mapped to the plurality of regions based at least in part on a probability of use for communication. According to one or more embodiments, the bit size of at least one of the plurality of code words corresponds to its probability for use for communication. According to one or more embodiments, the plurality of regions are a plurality of at least semi-polygonal regions. According to one or more embodiments, the selection of the plurality of code words begins at a center portion of the non-linear grid and continues outward until an average number of bits in the selection matches the target data rate.

According to one or more embodiments, a quantity of the plurality of regions is based at least in part on a coding compression scheme. According to one or more embodiments, a channel between the network node and the radio unit is an ethernet channel. According to one or more embodiments, the at least one code frame characteristic of the non-linear grid corresponds to at least one of a plurality of bit sizes for the plurality of regions, a power threshold for the plurality of regions and a companding function.

According to another aspect of the disclosure, a method implemented by a network node for communicating with at least one radio unit is provided. At least one code frame characteristic of a non-linear grid is determined. In-phase and quadrature, I/Q, data is mapped to non-linear grid that has a plurality of regions that correspond to a plurality of code words where a plurality of bit sizes of the plurality of code words is a function of a radial distance from an origin of the non-linear grid. A subset of the plurality of code words is selected based at least in part on a target data rate for transmission. Transmission of the I/Q data is caused based at least in part on the selected subset of the plurality of code words.

According to one or more embodiments, the plurality of code words are mapped to the plurality of regions based at least in part on a probability of use for communication. According to one or more embodiments, the bit size of at least one of the plurality of code words corresponds to a probability for use for communication. According to one or more embodiments, the plurality of regions are a plurality of at least semi-polygonal regions. According to one or more embodiments, the selection of the plurality of code words begins at a center portion of the non-linear grid and continues outward until an average number of bits in the selection matches the target data rate.

According to one or more embodiments, a quantity of the plurality of regions is based at least in part on a coding compression scheme. According to one or more embodiments, a channel between the network node and the at least one radio unit is an ethernet channel. According to one or more embodiments, the at least one code frame characteristic of the non-linear grid corresponds to at least one of a plurality of bit sizes for the plurality of regions, a power threshold for the plurality of regions and a companding function.

According to another aspect of the disclosure, a radio unit for communicating with a network node is provided. The radio unit includes processing circuitry configured to: receive a transmission of a subset of a plurality of code words where the subset of the plurality of code words corresponding to in-phase and quadrature (I/Q) data that has been mapped to a non-linear grid having a plurality of regions that correspond to the plurality of code words and where a plurality of bit sizes of the plurality of code words is a function of a radial distance from an origin of the non-linear grid, and determine the I/Q data based at least in part on the subset of the plurality of code words.

According to one or more embodiments, the plurality of code words are mapped to the plurality of regions based at least in part on a probability of use for communication. According to one or more embodiments, the bit size of at least one of the plurality of code words corresponds to a probability for use for communication. According to one or more embodiments, the plurality of regions are a plurality of at least semi-polygonal regions.

According to another aspect of the disclosure, a method implemented in a radio unit that is for communicating with a network node is provided. A transmission of a subset of a plurality of code words is received. The subset of the plurality of code words corresponds to in-phase and quadrature (I/Q) data that has been mapped to a non-linear grid having a plurality of regions that correspond to the plurality of code words. A plurality of bit sizes of the plurality of code words is a function of a radial distance from an origin of the non-linear grid. The I/Q data is determined based at least in part on the subset of the plurality of code words.

According to one or more embodiments, the plurality of code words are mapped to the plurality of regions based at least in part on a probability of use for communication. According to one or more embodiments, the bit size of at least one of the plurality of code words corresponds to a probability for use for communication. According to one or more embodiments, the plurality of regions are a plurality of at least semi-polygonal regions.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
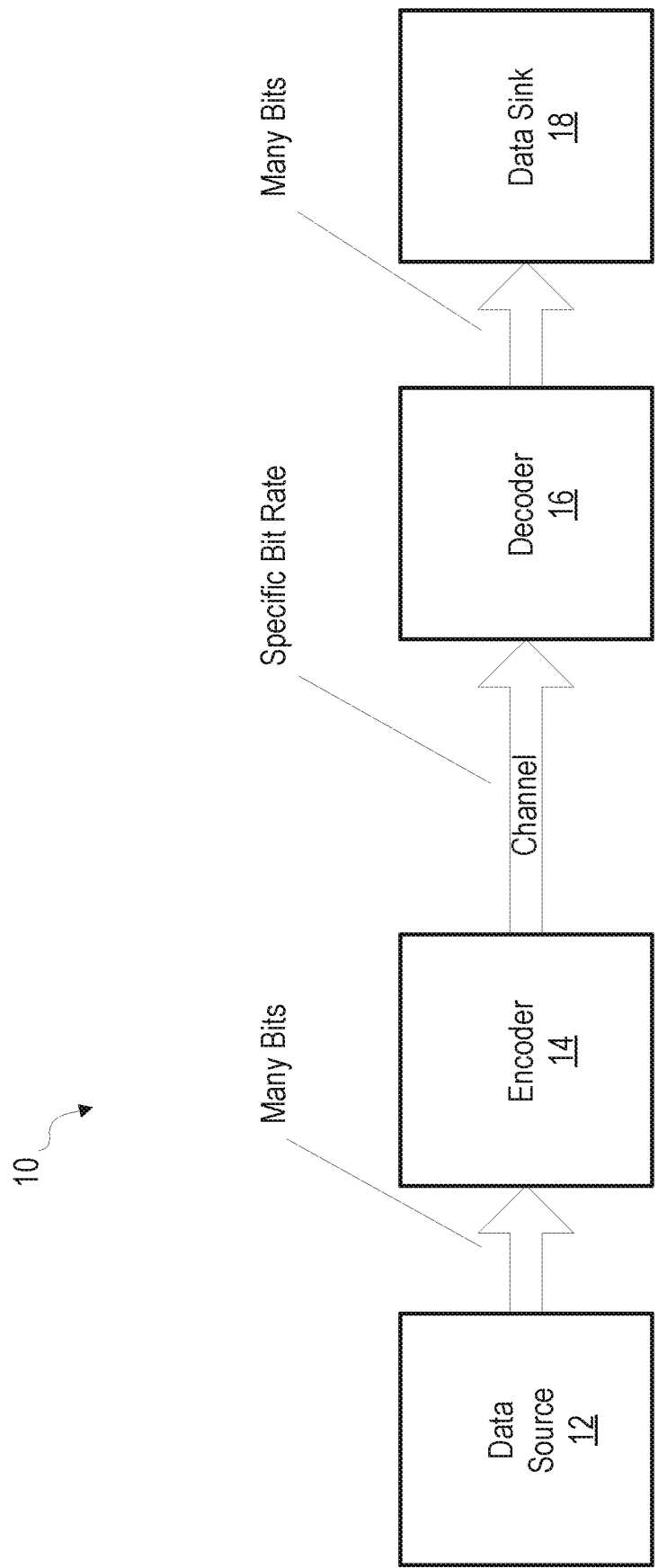
FIG. 1 is diagram of a general encoding and decoding scheme.

Before describing in detail exemplary embodiments, it is noted that the embodiments reside primarily in combinations of apparatus components and processing steps related to I/Q encoding for variable data rates. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein. Like numbers refer to like elements throughout the description.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

In some embodiments described herein, the term "coupled," "connected," and the like, may be used herein to indicate a connection, although not necessarily directly, and may include wired and/or wireless connections.

The term "network node" used herein can be any kind of network node comprised in a radio network which may further comprise any of base station (BS), radio base station, base transceiver station (BTS), base station controller (BSC), radio network controller (RNC), g Node B (gNB), radio dot system (RDS) node, evolved Node B (eNB or eNodeB), Node B, multi-standard radio (MSR) radio node such as MSR BS, multi-cell/multicast coordination entity (MCE), integrated access and backhaul (IAB) node, relay node, donor node controlling relay, radio access point (AP), transmission points, transmission nodes, Remote Radio Unit (RRU) Remote Radio Head (RRH), a core network node (e.g., mobile management entity (MME), self-organizing network (SON) node, a coordinating node, positioning node, MDT node, etc.), an external node (e.g., 3rd party node, a node external to the current network), nodes in distributed antenna system (DAS), a spectrum access system (SAS) node, an element management system (EMS), etc. The network node may also comprise test equipment.

In some embodiments, the non-limiting terms wireless device (WD) or a user equipment (UE) are used interchangeably. The WD herein can be any type of wireless device capable of communicating with at least one of a radio unit, a network node and another WD over radio signals, such as wireless device (WD). The WD may also be a radio communication device, target device, device to device (D2D) WD, machine type WD or WD capable of machine to machine communication (M2M), low-cost and/or low-complexity WD, a sensor equipped with WD, Tablet, mobile terminals, smart phone, laptop embedded equipped (LEE), laptop mounted equipment (LME), USB dongles, Customer Premises Equipment (CPE), an Internet of Things (IoT) device, or a Narrowband IoT (NB-IOT) device, etc.

Also, in some embodiments the generic term "radio network node" is used. It can be any kind of a radio network node which may comprise any of base station, radio base station, base transceiver station, base station controller, network controller, RNC, evolved Node B (eNB), Node B, gNB, Multi-cell/multicast Coordination Entity (MCE), IAB node, relay node, access point, radio access point, Remote Radio Unit (RRU) Remote Radio Head (RRH).

Note that although terminology from one particular wireless system, such as, for example, 3GPP LTE and/or New Radio (NR), may be used in this disclosure, this should not be seen as limiting the scope of the disclosure to only the aforementioned system. Other wireless systems, including without limitation Wide Band Code Division Multiple Access (WCDMA), Worldwide Interoperability for Microwave Access (WiMax), Ultra Mobile Broadband (UMB) and Global System for Mobile Communications (GSM), may also benefit from exploiting the ideas covered within this disclosure.

Note further, that functions described herein as being performed by radio unit or a network node may be distributed over a plurality of radio units and/or network nodes. In other words, it is contemplated that the functions of the network node and radio units described herein are not limited to performance by a single physical device and, in fact, can be distributed among several physical devices.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments provide I/Q encoding for variable transmission rates. In particular, given a predefined transmission format such as 10 gigabit Ethernet format, layer 3 based format, DRDI format etc., some bits may be taken from a potential allocation of bits for the channel such that less than all the bits for 10 gigabit Ethernet are available. The I/Q encoding described herein is able to maximize throughput in the channel such as when less than all bits are available due to some bits being "stolen" for other use.

Figure 2:
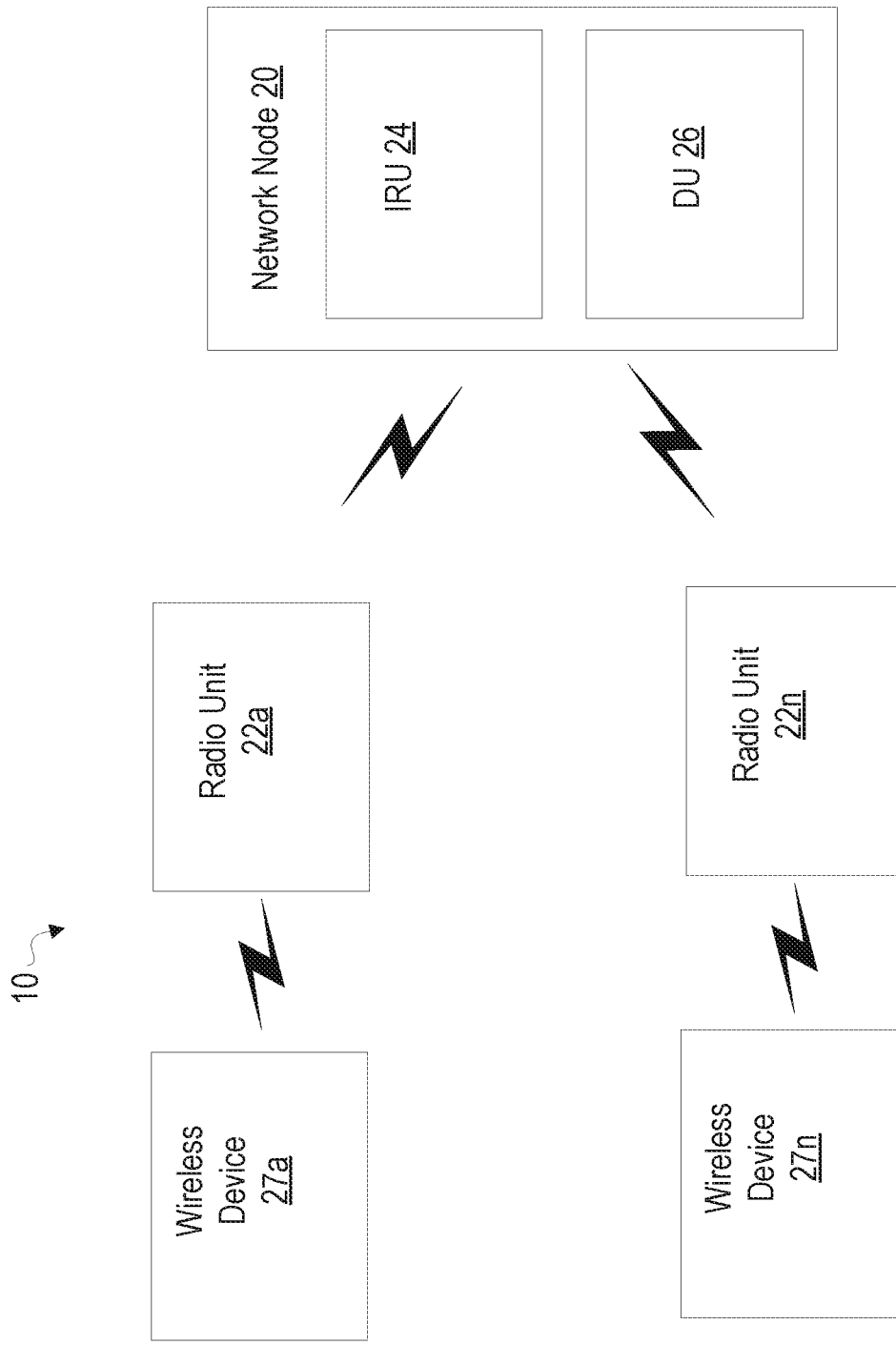
FIG. 2 is block diagram of a radio dot system.
Figure 3:
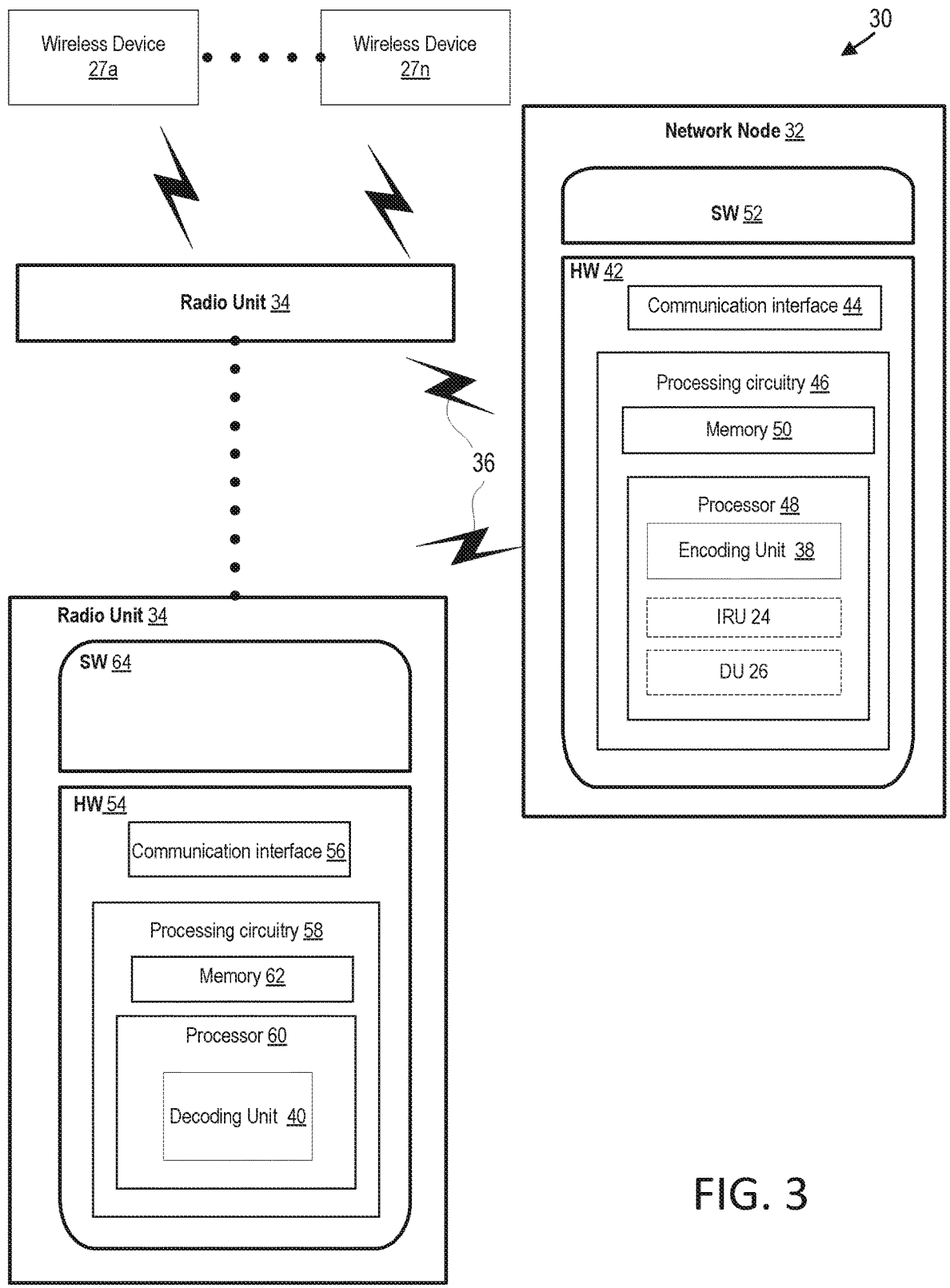
FIG. 3 is block diagram of an exemplary network architecture illustrating a communication system according to the principles in the present disclosure.

Referring again to the drawing figures, in which like elements are referred to by like reference numerals, there is shown in FIG. 3 a schematic diagram of a communication system 30, according to an embodiment, such as a 3GPP-type and/or based cellular network that may support standards such as LTE and/or NR (5G). System 30 includes one or more network nodes 32 for communicating with one or more radio units 34a-34n (collectively referred to as radio unit 34) via one or more communication channels 36 such as wired and/or wireless channels. In one or more embodiments, network node 32 may include indoor radio unit (IRU) 24 and digital unit (DU) 26 as described in FIG. 2 but where encoding is performed by encoding unit 38 for performing one or more network node 32 functions as described herein. Radio unit 34 provides general functions as described in FIG. 2 and has been further configured to include decoding unit 40 for performing one or more radio unit 34 functions as described herein.

Example implementations, in accordance with one or more embodiments, of network node 32 and radio unit 34 discussed in the preceding paragraphs will now be described in detail. Network node 32 is provided in a communication system 30 and includes hardware 42 enabling it to communicate with one or more radio units 34 for communication with one or more wireless devices 27. The hardware 42 may include a communication interface 44 for setting up and maintaining a wired or wireless connection with an interface of a different communication device of the communication system 30, and may allow for setting up and maintaining at least a wireless connection with one or more devices in communication system 30. In one or more embodiments, communication interface 44 may include, for example, one or more RF transmitters, one or more RF receivers, and/or one or more RF transceivers.

In the embodiment shown, the hardware 42 of the network node 32 further includes processing circuitry 46. The processing circuitry 46 may include a processor 48 and a memory 50. In particular, in addition to or instead of a processor, such as a central processing unit, and memory, the processing circuitry 46 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 48 may be configured to access (e.g., write to and/or read from) the memory 50, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory).

Thus, the network node 32 further has software 52 stored internally in, for example, memory 50, or stored in external memory (e.g., database, storage array, network storage device, etc.) accessible by the network node 32 via an external connection. The software 52 may be executable by the processing circuitry 46. The processing circuitry 46 may be configured to control any of the methods and/or processes described herein and/or to cause such methods, and/or processes to be performed, e.g., by network node 32. Processor 48 corresponds to one or more processors 48 for performing network node 32 functions described herein. The memory 50 is configured to store data, programmatic software code and/or other information described herein. In some embodiments, the software 52 may include instructions that, when executed by the processor 48 and/or processing circuitry 46, causes the processor 48 and/or processing circuitry 46 to perform the processes described herein with respect to network node 32. For example, processing circuitry 46 of the network node 32 may include encoding unit 38 configured to perform one or more network node 32 functions as described herein.

The communication system 30 further includes radio unit 34 already referred to. The radio unit 34 may have hardware 54 that may include a communication interface 56 configured to set up and maintain a wired and/or wireless connection with a network node 32 and/or other entities such as wireless devices 27 in communication system 30. In one or more embodiments, communication interface 56 may be formed as or may include, for example, one or more RF transmitters, one or more RF receivers, and/or one or more RF transceivers.

The hardware 54 of the radio unit 34 further includes processing circuitry 58. The processing circuitry 58 may include a processor 60 and memory 62. In particular, in addition to or instead of a processor, such as a central processing unit, and memory, the processing circuitry 58 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 60 may be configured to access (e.g., write to and/or read from) memory 62, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory).

Thus, the radio unit 34 may further comprise software 64, which is stored in, for example, memory 62 at the radio unit 34, or stored in external memory (e.g., database, storage array, network storage device, etc.) accessible by the radio unit 34. The software 64 may be executable by the processing circuitry 58.

The processing circuitry 58 may be configured to control any of the methods and/or processes described herein and/or to cause such methods, and/or processes to be performed, e.g., by radio unit 34. The processor 60 corresponds to one or more processors 60 for performing radio unit 34 functions described herein. The radio unit 34 includes memory 62 that is configured to store data, programmatic software code and/or other information described herein. In some embodiments, the software 64 may include instructions that, when executed by the processor 60 and/or processing circuitry 58, causes the processor 60 and/or processing circuitry 58 to perform the processes described herein with respect to radio unit 34. For example, the processing circuitry 58 of the radio unit 34 may include a decoding unit 40 configured to perform one or more radio unit 34 functions described herein.

Although FIG. 3 show various "units" such as encoding unit 38 and decoding unit 40 as being within a respective processor, it is contemplated that these units may be implemented such that a portion of the unit is stored in a corresponding memory within the processing circuitry. In other words, the units may be implemented in hardware or in a combination of hardware and software within the processing circuitry.

Figure 4:
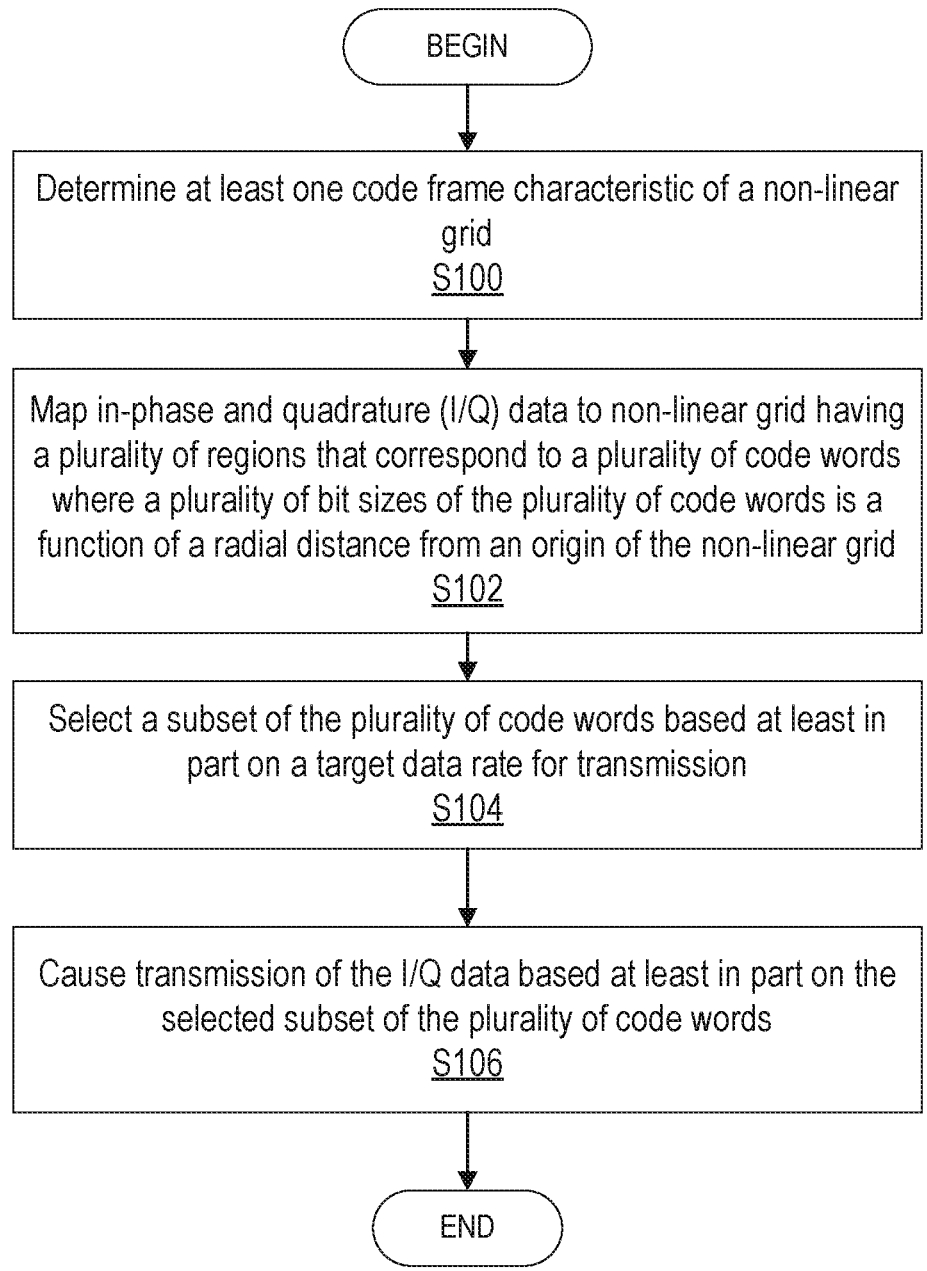
FIG. 4 is a flowchart of an exemplary process in a network node according to some embodiments of the present disclosure.

FIG. 4 is a flowchart of an exemplary process in a network node 32 according to one or more embodiments of the present disclosure. One or more Blocks and/or functions performed by network node 32 may be performed by one or more elements of network node 32 such as by encoding unit 38 in processing circuitry 46, processor 48, communication interface 44, etc.

Figure 5:
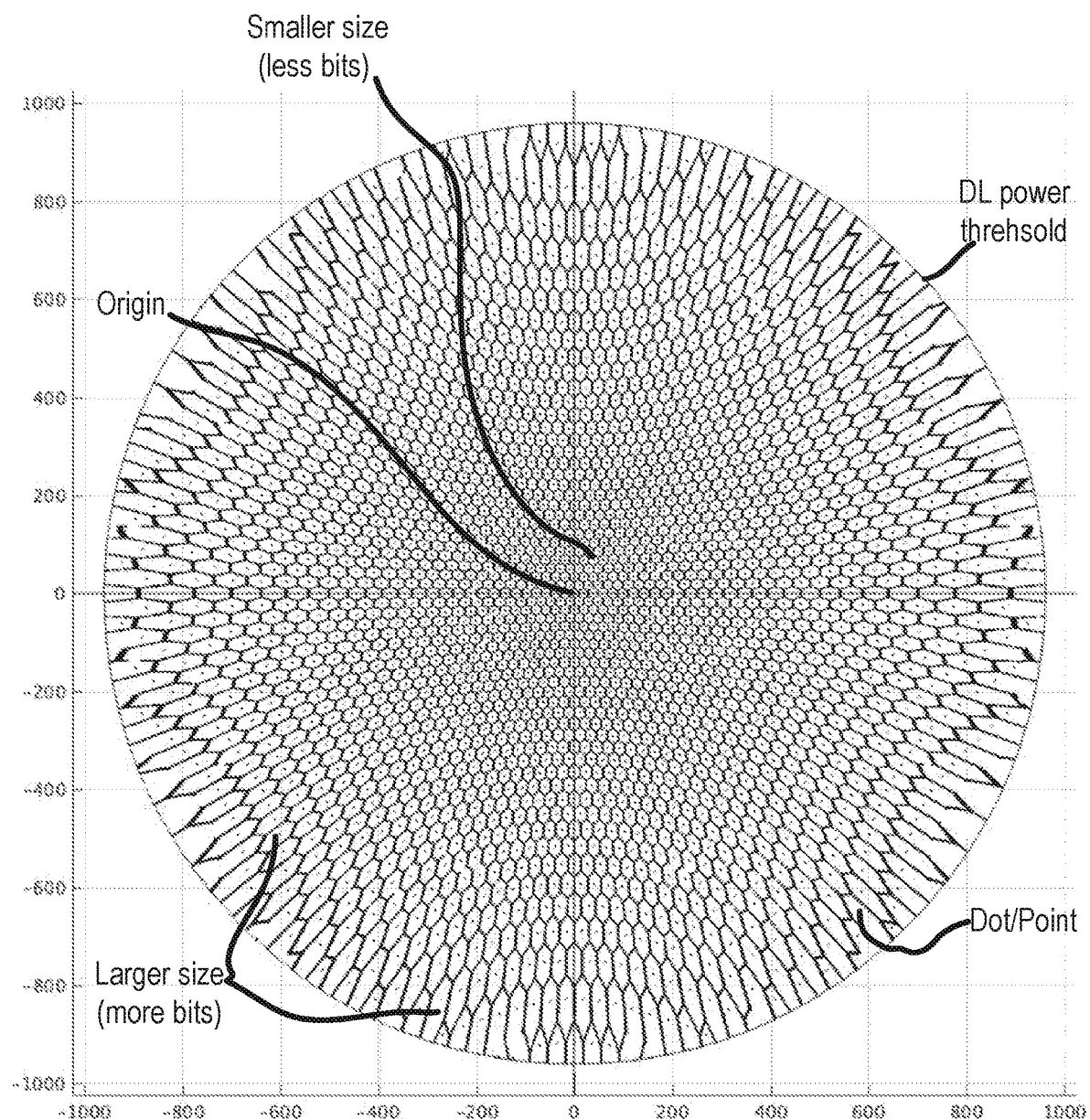
FIG. 5 is a diagram of a nonlinear I/Q mapping to constellation points according to some embodiments of the present disclosure.

In one or more embodiments, network node 32 such as via one or more of processing circuitry 46, processor 48 and communication interface 44 is configured to determine (Block S100) at least one code frame characteristic of a non-linear grid, as described herein. In one or more embodiments, network node 32 such as via one or more of processing circuitry 46, processor 48 and communication interface 44 is configured to map (Block S102) I/Q data to non-linear grid having a plurality of regions that correspond to a plurality of code words where a plurality of bit sizes of the plurality of code words is a function of a radial distance from an origin, i.e., origin point, of the non-linear grid, as described herein. For example, a nonlinear code is used which maps I/Q samples to code words regions in the Argand plane as illustrated in FIG. 5. As may be seen in FIG. 5, each code word is mapped to a generally polygonal region within the Argand plane. Near the center of the Argand plane, each polygonal region is generally hexagonal, although it may lack symmetry about one or more axes, and lines connective vertices may not be perfectly straight. Toward the perimeter of the Argand plane, the polygonal regions become increasingly "stretched" in the radial direction, any may become increasingly asymmetrical. In one or more embodiments, one or more of these stretched regions in the Argand plane may be considered at least semi-polygonal, where one or more of these stretched regions may have been polygonal before a compound functions is applied and at least a portion of the stretched region remains polygonal after the companding function. Each polygonal region represents a single code word where the dot in each polygonal shape/unit represents the I/Q point that the code word is mapped to. The regions may vary in size as a function of the radius, i.e., radial distance, where each region corresponds to a number/quantity of bits.

In this example, regions are generally polygonal in shape, growing in size as the distance from the origin increases. No sample may be mapped past a circle representing the maximum transmit power. The number of regions (and hence the number of code words) may not be fixed to be a particular number, but rather adjusted in an iterative manner in conjunction with the compression coding design. Code words are enumerated from the origin outwards, so that code words near the center have small values (i.e., smaller bit sizes or number of bits), code words near the edge have large values. In one or more embodiments, a number of leading zeros may match the number of code words that are selected.

In one or more embodiments, network node 32 such as via one or more of processing circuitry 46, processor 48 and communication interface 44 is configured to select (Block S104) a subset of the plurality of code words based at least in part on a target data rate for transmission, as described herein.

Figure 6:
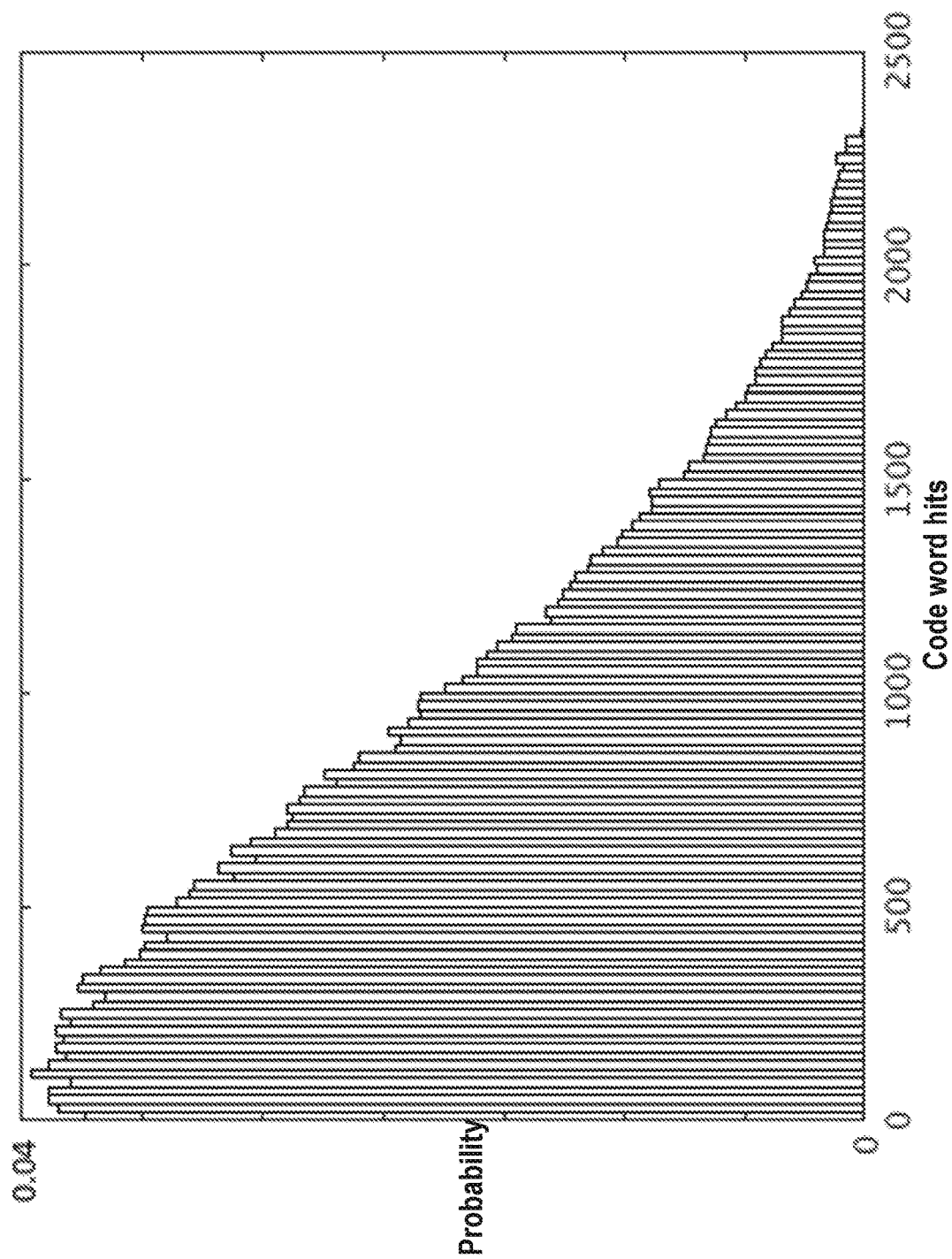
FIG. 6 is a graph of a hit count by code word according to some embodiments of the present disclosure.

For example, after mapping, the code word distribution may not be uniformly distributed as illustrated in FIG. 6. In particular, FIG. 6 illustrates the hit count by code word at the output of the nonlinear I/Q encoding where code words furthest from the origin of the mapping in FIG. 5 are less likely to occur. This may be a result of the Normal distributed nature of LTE or NR waveforms where small signals are more likely to be used than large ones. This allows for the use a variable rate data compression technique (such as Huffman compression as is known in the art) to reduce the average number of bits. In particular, once the average number of output bits have been determined, the number of coding regions in the non-linear mapping can be adjusted (selected) so that the average number of bits flowing to the inter-unit channel can be exactly matched to the available bandwidth of, for example, a channel. In the examples shown in FIGS. 5-6, the number of coding regions was determined to be 2304, since the coding compression was estimated to be 8/9 and the target rate at the output was 11 bits/sample. However, other configurations are possible in light of the teachings of the disclosure.

Figure 7:
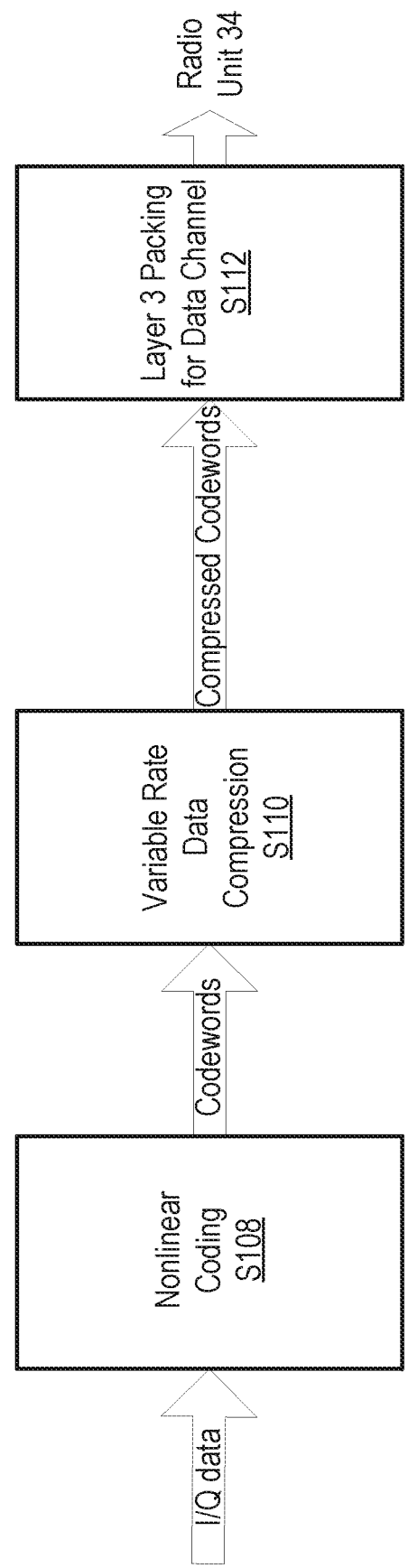
FIG. 7 is a flow diagram of a compression technique according to some embodiments of the present disclosure.

In one or more embodiments, network node 32 such as via one or more of processing circuitry 46, processor 48 and communication interface 44 is configured to cause (Block S106) transmission of the I/Q data based at least in part on the selected subset of the plurality of code words, as described herein. For example, after the variable rate compression, data is packed up in some form of Layer 3 packet and sent to the receiving device such as a radio unit 34 as illustrated in FIG. 7. In an alternative embodiment illustrated in FIG. 8, several I/Q streams feeding a single variable rate data compression block are used to reduce the normalized standard deviation of the output rate.

According to one or more embodiments, the plurality of code words are mapped to the plurality of regions based at least in part on a probability of use for communication. According to one or more embodiments, the bit size of at least one of the plurality of code words corresponds to a probability for use for communication. According to one or more embodiments, the plurality of regions are a plurality of at least semi-polygonal regions. According to one or more embodiments, the selection of the plurality of code words begins at a center portion of the non-linear grid and continues outward until an average number of bits in the selection matches the target data rate.

According to one or more embodiments, a quantity of the plurality of regions is based at least in part on a coding compression scheme. According to one or more embodiments, a channel between the network node and the radio unit is an ethernet channel. According to one or more embodiments, the at least one code frame characteristic of the non-linear grid corresponds to at least one of a plurality of bit sizes for the plurality of regions, a power threshold for the plurality of regions and a companding function.

At the radio unit 34, I/Q recovery is performed by decompressing the received data to yield the original code words as each code word is mapped to a specific I/Q point. These are the dots/points identified in FIG. 5.

FIG. 7 is a flow diagram of an example of a process performed by network node 32 such as for performing encoding in accordance with one or more embodiments of the disclosure. One or more Blocks and/or functions performed by network node 32 may be performed by one or more elements of network node 32 such as by encoding unit 38 in processing circuitry 46, processor 48, communication interface 44, etc. In one or more embodiments, network node 32 such as via one or more of processing circuitry 46, processor 48 and communication interface 44 is configured to perform (Block S108) nonlinear coding as described herein. In one or more embodiments, network node 32 such as via one or more of processing circuitry 46, processor 48 and communication interface 44 is configured to perform (Block S110) variable rate data compression of code words as described herein. In one or more embodiments, network node 32 such as via one or more of processing circuitry 46, processor 48 and communication interface 44 is configured to perform (Block S112) layer 3 packing for data channel transmission of the compressed code words, as described herein.

Figure 8:
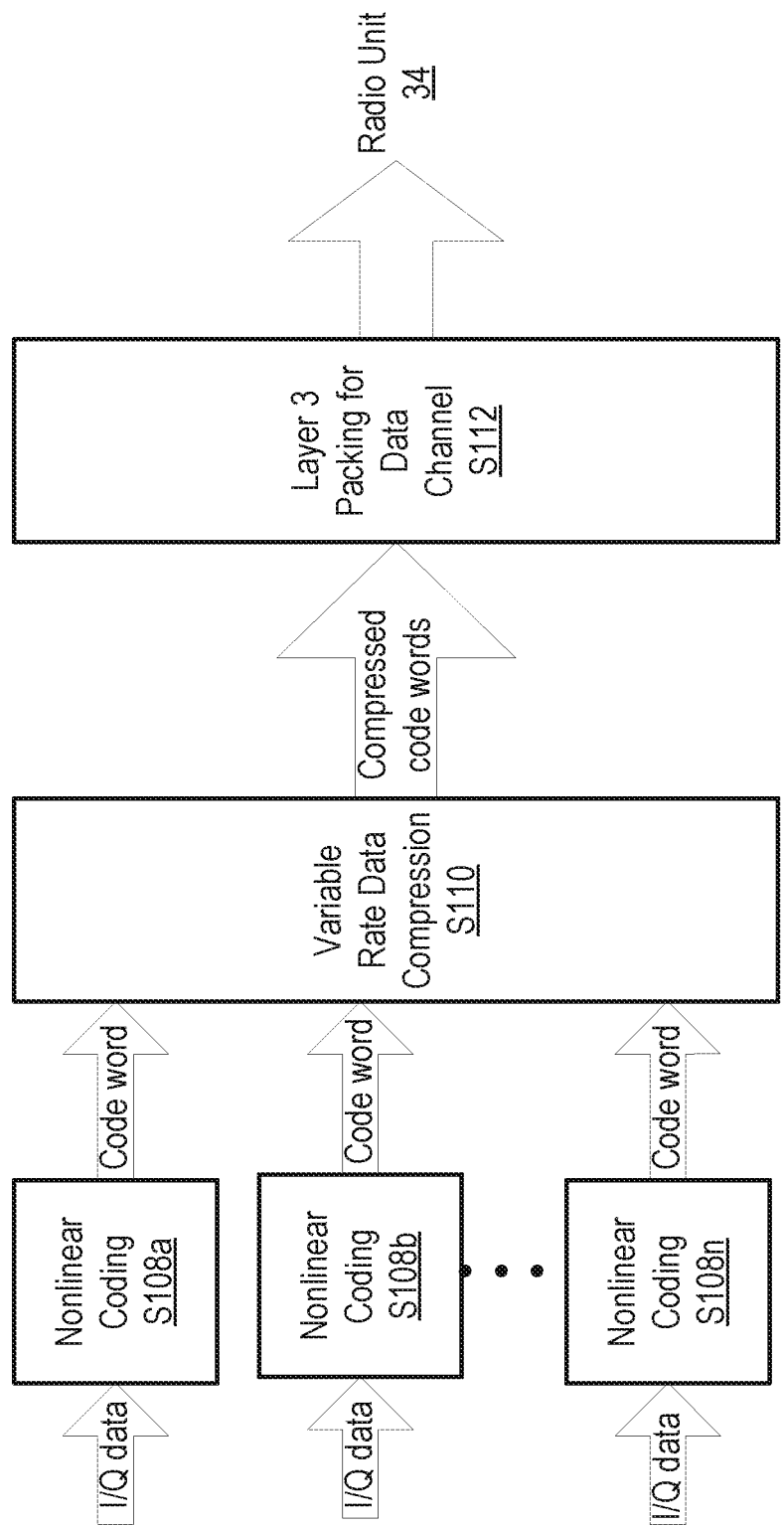
FIG. 8 is a flow diagram of another compression technique according to some embodiments of the present disclosure.

FIG. 8 is a flow diagram of another example of a process performed by network node 32 such as for performing encoding in accordance with one or more embodiments of the disclosure. In particular, Blocks S108-112 are described with respect to FIG. 7 except that multiple streams of I/Q data are nonlinear coded at Blocks S108a-n which are then compressed at Block S110.

Figure 9:
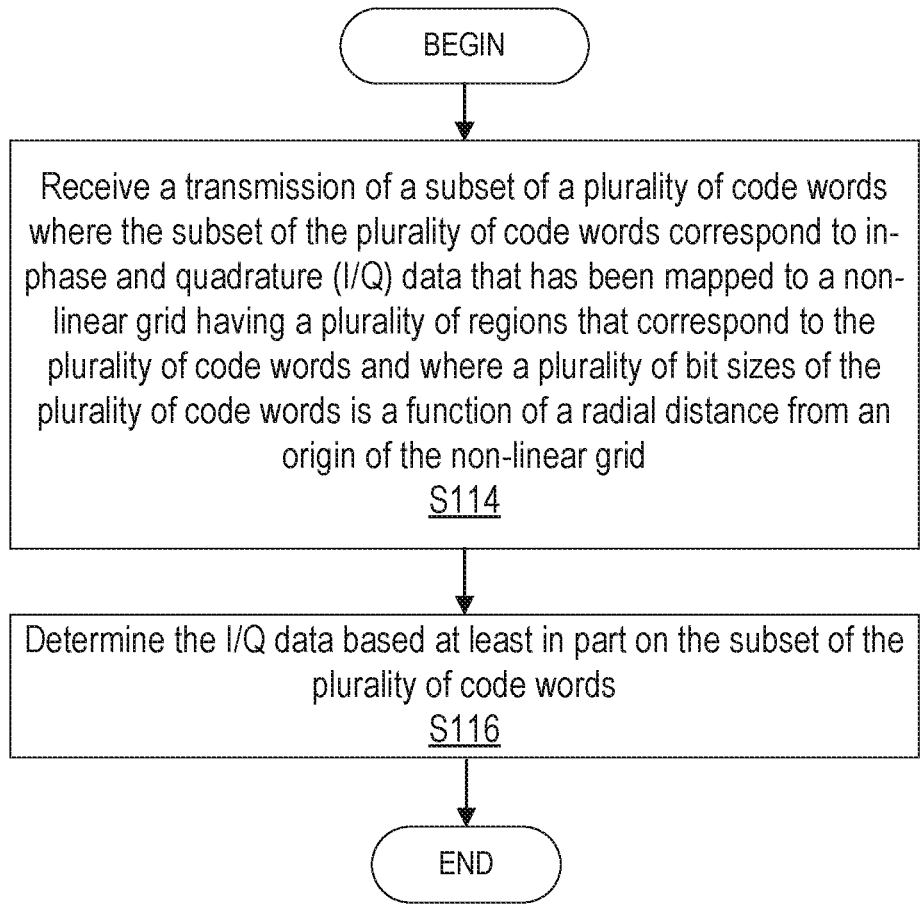
FIG. 9 is a flowchart of an exemplary process in a radio unit according to some embodiments of the present disclosure.

FIG. 9 is a flowchart of an exemplary process in a radio unit 34 according to one or more embodiments of the present disclosure. One or more Blocks and/or functions performed by radio unit 34 may be performed by one or more elements of radio unit 34 such as by decoding unit 40 in processing circuitry 58, processor 60, communication interface 56, etc. The radio unit 34 may include one or more antennas for transmitting and/or receiving wireless signals. In one or more embodiments, radio unit 34 such as via one or more of processing circuitry 58, processor 60 and communication interface 56 is configured to receive (Block S114) a transmission of a subset of a plurality of code words where the subset of the plurality of code words corresponds to I/Q data that has been mapped to a non-linear grid having a plurality of regions that correspond to the plurality of code words and where a plurality of bit sizes of the plurality of code words is a function of a radial distance from an origin of the non-linear grid, as described herein. The radio unit 34 may include one or more antennas for transmitting and/or receiving wireless signals. In one or more embodiments, radio unit 34 such as via one or more of processing circuitry 58, processor 60 and communication interface 56 is configured to determine (Block S116) the I/Q data based at least in part on the subset of the plurality of code words. For example, the radio unit 34 may be preconfigured to translate compression, i.e., compressed data, to I/Q data for wireless device 27.

According to one or more embodiments, the plurality of code words are mapped to the plurality of regions based at least in part on a probability of use for communication. According to one or more embodiments, the bit size of at least one of the plurality of code words corresponds to a probability for use for communication. According to one or more embodiments, the plurality of regions are a plurality of at least semi-polygonal regions.

Therefore, in one or more embodiments, an algorithm is provided that makes use of nonlinear I/Q mapping to map I/Q data to an arbitrary number of code words. Statistics of the I/Q data enable variable rate data encoding to be used. The number of codes words is adjusted so that after the variable rate encoding, the average rate is the target channel data rate thereby allowing the produced bit stream of compressed words to be compatible and/or match the available transmission rate, i.e., specific bit rate of the channel. In one or more embodiments, when the I/Q data rate and the channel bit rates are fixed, this technique allows the maximum number of bits consistent with the channel bandwidth. In one or more embodiments, the combination of variable length encoding and decreasing probability of code words as a function of size means that the effective code word size can be set to an arbitrary, non-integer numbers such that the encoding scheme allows for an arbitrary number of regions for mapping. By adjusting the number of regions and using the region shaping algorithm, i.e., mapping algorithm, described herein, the number of regions can be exactly fit to the allocated bandwidth of a channel.

EXAMPLE

Example A1

A method in a network node 32 for transmitting data through a downstream channel that has a known bandwidth, the method comprising:
    mapping I/Q samples to corresponding ones of a plurality of code words, each code word being associated with a respective sample region in the Argand plane and having a size that is a function of a radio distance between the origin of the Argand plane and the sample region;

determining an average size of the code words generated by the mapping; and adjusting the plurality of code words to minimize a difference between the determined average size of the code words generated by the mapping and the known bandwidth of the downstream channel.

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A network node for communicating with at least one radio unit, the network node comprising processing circuitry configured to: determine at least one code frame characteristic of a non-linear grid that corresponds to an Argand plane having a plurality of polygonal regions, the at least one code frame characteristic of the non-linear grid corresponding to at least one of a plurality of bits per code word for the plurality of polygonal regions, a power threshold for the plurality of polygonal regions and a companding function; map in-phase and quadrature, I/Q, data to corresponding ones of a plurality of code words, each code word being associated with a respective region in the Argand plane and having a size in terms of bits that is a function of a radial distance from an origin of the Argand plane; determine an average size of the code words generated by the mapping; adjust the plurality of code words to minimize the difference between the determined average size of the code words generated by the mapping and the known bandwidth of the downstream channel; cause transmission of the I/Q data based at least in part on the adjusted plurality of code words.

2. The network node of claim 1, wherein the plurality of code words are mapped to the plurality of polygonal regions based at least in part on a probability of use for communication.

3. The network node of claim 1, wherein the bit size of at least one of the plurality of code words corresponds to a probability for use for communication.

4. The network node of claim 1, wherein the selection of the plurality of code words begins at a center portion of the non-linear grid and continues outward until an average number of bits in the selection matches the target data rate.

5. The network node of claim 1, wherein a quantity of the plurality of polygonal regions is based at least in part on a coding compression scheme.

6. The network node of claim 1, wherein a channel between the network node and the radio unit is an ethernet channel.

7. A method implemented by a network node for communicating with at least one radio unit, the method comprising: determining at least one code frame characteristic of a non-linear grid that corresponds to an Argand plane having a plurality of polygonal regions, the at least one code frame characteristic of the non-linear grid corresponding to at least one of a plurality of bits per code word for the plurality of polygonal regions, a power threshold for the plurality of polygonal regions and a companding function; mapping in-phase and quadrature, I/Q, data to corresponding ones of a plurality of code words, each code word being associated with a respective region in the Argand plane and having a size in terms of bits that is a function of a radial distance from an origin of the Argand plane; determining an average size of the code words generated by the mapping; adjusting the plurality of code words to minimize the difference between the determined average size of the code words generated by the mapping and the known bandwidth of the downstream channel; causing transmission of the I/Q data based at least in part on the adjusted plurality of code words.

8. The method of claim 7, wherein the plurality of code words are mapped to the plurality of polygonal regions based at least in part on a probability of use for communication.

9. The method of claim 7, wherein the bit size of at least one of the plurality of code words corresponds to a probability for use for communication.

10. The method of claim 7, wherein the selection of the plurality of code words begins at a center portion of the non-linear grid and continues outward until an average number of bits in the selection matches the target data rate.

11. The method of claim 7, wherein a quantity of the plurality of polygonal regions is based at least in part on a coding compression scheme.

12. The method of claim 7, wherein a channel between the network node and the at least one radio unit is an ethernet channel.

13. A radio unit for communicating with a network node, the radio unit comprising: processing circuitry configured to: receive a transmission of an adjusted plurality of code words, the adjusted plurality of code words corresponding to in-phase and quadrature, I/Q, data that has been mapped to corresponding ones of a plurality of code words, each code word being associated with a respective region in an Argand plane having a plurality of polygonal regions and having a size in terms of bits that is a function of a radial distance from an origin of the Argand plane; and determine the I/Q data based at least in part on the adjusted plurality of code words, wherein the plurality of code words are adjusted to minimize the difference between the average size of the code words, generated by the mapping of I/Q data to corresponding ones of the plurality of code words, and the known bandwidth of the downstream channel and wherein at least one code characteristic of anon-linear grid that corresponds to the Argand plane having the plurality of polygonal regions corresponds to at least one of a plurality of bits per code word for the plurality of polygonal regions, a power threshold for the plurality of polygonal regions and a companding function.

14. The radio unit of claim 13, wherein the plurality of code words are mapped to the plurality of polygonal regions based at least in part on a probability of use for communication.

15. The radio unit of claim 13, wherein the bit size of at least one of the plurality of code words corresponds to a probability for use for communication.

16. A method implemented in a radio unit for communicating with a network node, the method comprising: receiving a transmission of an adjusted plurality of code words, the adjusted plurality of code words corresponding to in-phase and quadrature, I/Q, data that has been mapped to corresponding ones of a plurality of code words, each code word being associated with a respective region in an Argand plane having a plurality of polygonal regions and having a size in terms of bits that is a function of a radial distance from an origin of the Argand plane; and determining the I/Q data based at least in part on the adjusted plurality of code words, wherein the plurality of code words are adjusted to minimize the difference between the average size of the code words, generated by the mapping of I/Q data to corresponding ones of the plurality of code words, and the known bandwidth of the downstream channel and wherein at least one code frame characteristic of anon-linear grid that corresponds to the Argand plane having the plurality of polygonal regions corresponds to at least one of a plurality of bits per code word for the plurality of polygonal regions, a power threshold for the plurality of polygonal regions and a companding function.

17. The method of claim 16, wherein the plurality of code words are mapped to the plurality of polygonal regions based at least in part on a probability of use for communication.

18. The method of claim 16, wherein the bit size of at least one of the plurality of code words corresponds to a probability for use for communication.

* * * * *